(12) United States Patent
Wang

(10) Patent No.: US 10,422,876 B2
(45) Date of Patent: Sep. 24, 2019

(54) OPTICAL SENSOR ARRANGEMENT

(71) Applicant: ams AG, Unterpremstaetten (AT)

(72) Inventor: Yu Wang, Plano, TX (US)

( * ) Notice: Subject to any disclaimer, the term of this patent is extended or adjusted under 35 U.S.C. 154(b) by 6 days.

(21) Appl. No.: 15/579,914

(22) PCT Filed: May 10, 2016

(86) PCT No.: PCT/EP2016/060464
§ 371 (c)(1),
(2) Date: Dec. 5, 2017

(87) PCT Pub. No.: WO2016/198228
PCT Pub. Date: Dec. 15, 2016

(65) Prior Publication Data
US 2018/0224546 A1 Aug. 9, 2018

Related U.S. Application Data

(60) Provisional application No. 62/172,487, filed on Jun. 8, 2015.

(30) Foreign Application Priority Data

Jul. 3, 2015 (EP) ..................................... 15175278

(51) Int. Cl.
*G01S 17/02* (2006.01)
*G01J 1/02* (2006.01)
(Continued)

(52) U.S. Cl.
CPC .......... *G01S 17/026* (2013.01); *G01J 1/0271* (2013.01); *G01S 7/4813* (2013.01); *G01V 8/12* (2013.01);
(Continued)

(58) Field of Classification Search
CPC .... G01S 17/026; G01S 7/4813; G01J 1/0271; G01V 8/14; G06F 3/017; G06F 3/0304; H03K 17/941; H03K 2217/94108
See application file for complete search history.

(56) References Cited

U.S. PATENT DOCUMENTS

2008/0006762 A1   1/2008  Fadell et al.
2012/0129580 A1   5/2012  Tam
(Continued)

FOREIGN PATENT DOCUMENTS

EP   2565603 A2   3/2013
EP   2640041 A1   9/2013

*Primary Examiner* — Christine S. Kim
(74) *Attorney, Agent, or Firm* — Fish & Richardson P.C.

(57) ABSTRACT

An optical sensor arrangement comprises an emitting device (E) and a detection device (D) configured to emit and detect, respectively, electromagnetic radiation and a cover (C) arranged to cover the emitting and the detection device (E, D). The sensor arrangement comprises a first cover layer (C1) partially covering an inner surface of the cover (C) and having a first and a second opening located above the emitting and the detection device (E, D), respectively. The sensor arrangement comprises a second and a third cover layer (C2, C3) covering the inner surface at areas of the first and the second opening. A reflection and/or an absorption characteristics of at least one of the second and third cover layer (C2, C3) is adapted to a reflection and/or an absorption characteristics of the first cover layer (C1) for incident light within the specified spectrum.

35 Claims, 2 Drawing Sheets

(51) Int. Cl.
G01S 7/481 (2006.01)
G01V 8/12 (2006.01)
G06F 3/03 (2006.01)
H03K 17/94 (2006.01)
G06F 3/01 (2006.01)
G01V 8/14 (2006.01)

(52) U.S. Cl.
CPC ............... G01V 8/14 (2013.01); G06F 3/017 (2013.01); G06F 3/0304 (2013.01); H03K 17/941 (2013.01); *H03K 2217/94108* (2013.01)

(56) References Cited

U.S. PATENT DOCUMENTS

| | | | | |
|---|---|---|---|---|
| 2012/0295665 | A1* | 11/2012 | Pantfoerder | G01J 1/0407 455/566 |
| 2013/0267273 | A1* | 10/2013 | Rudmann | G01S 17/026 455/556.1 |
| 2016/0056194 | A1* | 2/2016 | Rudmann | H01L 27/14625 257/98 |

* cited by examiner

OPTICAL SENSOR ARRANGEMENT

BACKGROUND OF THE INVENTION

The present invention relates to an optical sensor arrangement, and a proximity sensor arrangement and a gesture sensor arrangement.

Optical proximity and gesture sensors may be used widely in modern smart phones. Optical proximity or gesture sensors may be implemented as active sensors being able to detect the presence and movement, respectively, of nearby objects without physical contact. An optical proximity or gesture sensor may emit light, for example visible or infrared light, and detect the light returning after being reflected by an object. Since the light emitting device and the detection device may be positioned adjacent to each other and the light may have to pass through a cover glass or cover plastic for example with ink printed on it, light may get reflected by the cover or scattered by the ink and consequently be detected without having left the sensor arrangement and reached an object. This phenomenon is denoted as optical crosstalk and may lead to errors in the detection.

For example, for cosmetic reasons some existing sensor arrangements use only one aperture for both the emitting device and the detection device. However, typically this may imply a relatively short distance between the emitting device and the detection device, in turn causing increased optical crosstalk.

SUMMARY OF THE INVENTION

According to the improved concept, a first cover layer of an optical sensor arrangement has two openings or apertures located above an emitting device and a detection device, respectively. Depending on the optical properties of the first cover layer, at least one of the openings is covered with another cover layer having optical properties that are adapted to the optical properties of first cover layer. In particular, the other cover layer may render the respective opening effectively invisible to the human eye or reduce the visibility of the opening. In other words, the respective opening is camouflaged or disguised by adapting said optical properties. Since two openings or apertures are used, a distance or separation between the emitting device and the detection device may be increased to reduce optical crosstalk.

The optical sensor arrangement may, for example, be integrated in a portable electronic device, for example a smart phone or a tablet computer.

Here and in the following, the terms "light" and "electromagnetic radiation" are used in an exchangeable manner. Thus, "light" may describe any kind of electromagnetic radiation, not only visible light, in particular also infrared light.

According to the improved concept, an optical sensor arrangement is provided. The optical sensor arrangement comprises an emitting device and a detection device. The emitting device is configured to emit electromagnetic radiation and the detection device is configured to detect electromagnetic radiation.

The optical sensor arrangement further comprises a cover being transparent or translucent to visible light and arranged to cover the emitting device and the detection device. The cover comprises an inner surface facing the emitting device and the detection device. The optical sensor arrangement also comprises a first cover layer partially covering the inner surface and having a first opening located above the emitting device and a second opening located above the detection device.

The optical sensor arrangement also comprises a second cover layer covering the inner surface at an area of the first opening and a third cover layer covering the inner surface at an area of the second opening. A reflection and/or an absorption characteristics for incident light within a specified spectrum of visible light of at least one of the second and third cover layer is adapted to a reflection and/or an absorption characteristics of the first cover layer for incident light within the specified spectrum.

The detection device may in particular be configured to detect, that is be sensitive to, the type of electromagnetic radiation being emitted by the emitting device. In addition, the detection device may be sensitive to another type of electromagnetic radiation. In particular, the other type of electromagnetic radiation may be visible light or a certain fraction of the spectrum of visible light.

The cover may for example be part of the electronic device within which the optical sensor arrangement is integrated. Alternatively, the cover may be a part of a package of the optical sensor arrangement, in particular of the emitting device and/or the detection device. The cover may for example comprise or consist of a glass, a plastic material, a flexible material, a foil or the like.

Visible light means electromagnetic radiation within the full visible spectrum. The full visible spectrum corresponds to electromagnetic radiation being visible to the human eye, which is, for example, light with a wavelength from approximately 380 nm to approximately 780 nm.

The cover being translucent for visible light means that the cover or a material of which the cover consists allows visible light to pass the cover with or without being scattered. The cover being transparent for visible light means that the cover or a material of which the cover consists allows visible light to pass the cover without being scattered, or nearly without being scattered. The covered being transparent or translucent for visible light does not necessarily imply that a transmittance is constant within the full visible spectrum.

The cover may for example be designed to protect the emitting device, the detection device and/or the package from external influences as for example dust particles, mechanical damage, humidity or the like.

The first cover layer may for example be designed to avoid crosstalk between the emitting device and the detection device. Therein, the term crosstalk denotes electromagnetic radiation being emitted by the emitting device and detected by the detection device without leaving the optical sensor arrangement. For example, the radiation emitted by the emitting device may be reflected by the cover, the housing or any other component of the optical sensor arrangement before it can leave the optical sensor arrangement. Such radiation may then directly be detected by the detection device and may cause unwanted or inaccurate sensor signals.

Incident light denotes light incident from outside of the optical sensor arrangement. In particular, incident light hits the cover at an outer surface of the cover, the outer side being opposite of the inner surface of the cover.

According to some implementations of the optical sensor arrangement, the specified spectrum of visible light corresponds to the full spectrum of visible light. In particular, the specified spectrum may correspond to light with a wavelength from 380 nm or approximately 380 nm to 780 nm or approximately 780 nm. In other words, the specified spectrum may correspond to white light.

According to some implementations of the optical sensor arrangement, the specified spectrum of visible light corresponds to a fraction of the full spectrum of visible light. For example, the specified spectrum may correspond to light of a certain color.

For example, the specified spectrum may correspond to a color of light being reflected, or being predominantly reflected, by the first cover layer when incident to the optical sensor arrangement. In other words, the specified spectrum may correspond to a color of the first cover layer, in particular of a side of the first cover layer facing the cover.

According to some implementations of the optical sensor arrangement, the first cover layer has an inner side facing the emitting device and the detection device and an outer side facing the cover, in particular the inner surface of the cover. A reflection and/or an absorption characteristics of the first cover layer may be the same or different on the inner side and on the outer side. Consequently, a reflection and/or an absorption characteristics of the first cover layer may be the same or different for incident light and for other light, for example light coming directly from the emitting device.

According to some implementations of the optical sensor arrangement, the reflection and/or absorption characteristics of the first cover layer may for example correspond to an average reflectance and/or an average absorptance for incident light within the specified spectrum. Absorptance is e.g. defined as the ratio of radiant energy absorbed by a body to that incident upon it.

According to some implementations of the optical sensor arrangement, the reflection and/or absorption characteristics of the at least one of the second and third cover layer may for example correspond to an average reflectance and/or an average absorptance for incident light within the specified spectrum.

The reflection and/or absorption characteristics of the at least one of the second and third cover layer may for example correspond to the average reflectance and/or the average absorptance of the at least one of the second and third cover layer for incident light within the specified spectrum being equal or approximately equal to the average reflectance and/or the average absorptance of the first cover layer for incident light within the specified spectrum.

The reflection and/or absorption characteristics of the at least one of the second and third cover layer may for example correspond to a color or a color impression of the at least one of the second and third cover layer being equal or approximately equal to a color or a color impression of the first cover layer for incident light within the specified spectrum.

According to some implementations of the optical sensor arrangement, the first cover layer is deposited or printed on the inner surface of the cover. In other implementations, the inner surface of the cover is coated with the first cover layer.

According to some implementations, the emitting device is configured to emit electromagnetic radiation within an emission spectrum. The emission spectrum may for example lie in an infrared range and/or in another invisible range of electromagnetic radiation. Alternatively or in addition, the emission spectrum may for example lie in the range of visible light. The cover is transparent or translucent for electromagnetic radiation within the emission spectrum.

According to some implementations of the optical sensor arrangement, the first cover layer comprises, on a side facing the emitting device and the detection device, an absorptive layer having an average absorptance being greater than or equal to a specified first absorptance threshold value for light within the emission spectrum of the emitting device.

The absorptive layer may for example be a black layer, for example a black ink layer. The absorptive layer is for example deposited or printed on the inner surface of the cover. In other implementations, the inner surface of the cover is coated with the absorptive layer. The first absorptance threshold value may for example be equal to or greater than 90%, for example equal to or greater than 95%.

According to some implementations, the first cover layer consists of the absorptive layer. According to other implementations, the first cover layer consists of a series of at least two layers comprising the absorptive layer, wherein the absorptive layer is arranged on a side of the series of at least two layers that faces the emitting device and the detection device.

According to some implementations of the optical sensor arrangement, the second cover layer is implemented as a filter layer for passing light within the emission spectrum and for blocking light within the specified spectrum.

According to some implementations of the sensor arrangement, the second cover layer has an average absorptance greater than or equal to a specified second absorptance threshold value for light within the specified spectrum. The second absorptance threshold value may for example be equal to or greater than 90%, for example equal to or greater than 95%.

According to some implementations of the sensor arrangement, the second cover layer has an average transmittance greater than or equal to a specified first transmittance threshold value for light within the emission spectrum. The first transmittance threshold value may for example be equal to or greater than 60%, for example equal or greater than 70%, for example equal to or greater than 80%.

According to some implementations of the optical sensor arrangement, the third cover layer is implemented as a filter layer for passing light within the emission spectrum and for blocking light within the specified spectrum.

According to some implementations of the sensor arrangement, the third cover layer has an average transmittance being greater than or equal to a specified second transmittance threshold value for light within the emission spectrum. The second transmittance threshold value may for example be greater than the first transmittance threshold value. The second transmittance threshold value may for example be equal to or greater than 70%, for example equal to or greater than 80%, for example equal to or greater than 90%.

According to some implementations of the sensor arrangement, the third cover layer has an average transmittance being greater than or equal to a specified third transmittance threshold value for light within the specified spectrum. The third transmittance threshold value may for example be smaller than the first and/or the second transmittance threshold value. The third transmittance threshold value may for example be equal to or greater than 5%, for example equal to or greater than 10%.

According to some implementations of the optical sensor arrangement, the first cover layer comprises, on a side facing the cover, a reflective layer having an average reflectance being greater than or equal to a specified first reflectance threshold value for incident light within the specified spectrum. The first reflectance threshold value may for example be equal to or greater than 70%, for example equal to a greater than 80%, for example equal to or greater than 90%.

The reflective layer may for example be a white layer, a grey layer or a colored layer, for example a white, a grey or a colored ink layer. The reflective layer is for example deposited or printed on the inner surface of the cover. In other implementations, the inner surface of the cover is coated with the reflective layer.

According to some implementations, the first cover layer consists of the reflective layer. According to other implementations, the first cover layer consists of a series of at least two layers comprising the reflective layer, wherein the reflective layer is arranged on a side of the series of at least two layers that faces the cover. According to some implementations, the first cover layer consists of the absorptive layer and the reflective layer arranged such that the absorptive layer faces the emitting device and the detection device and the reflective layer faces the cover. The absorptive layer is for example deposited or printed on the reflective layer. In other implementations, the inner surface of the cover is first coated with the reflective layer and afterwards the cover with the reflective layer is coated with the absorptive layer.

According to some implementations of the optical sensor arrangement, the third cover layer has an average reflectance greater than or equal to a specified second reflectance threshold value for incident light within the specified spectrum. The second reflectance threshold value may for example be equal to or greater than 70%, for example equal to a greater than 80%, for example equal to or greater than 90%. In particular, the second reflectance threshold value may for example be equal to or approximately equal to the first reflectance threshold value.

According to some implementations of the optical sensor arrangement, the third cover layer is implemented as a diffusive layer for light within the emission spectrum and/or within the specified spectrum. The term diffusive layer means here that light passing the third cover layer does not follow Snell's law of reflection within the third cover layer and/or at boundaries of the third cover layer. Instead, light passing the third cover layer may be scattered within the third cover layer and/or at boundaries of the third cover layer. That is, in such implementations the third cover layer is implemented as a translucent layer for light within the emission spectrum and/or the specified spectrum.

According to some implementations of the optical sensor arrangement, at least one of the first, the second and the third cover layer comprises an ink and/or a plastic material. In particular, at least one of the first, the second and the third cover layer may consist of an ink or a plastic material.

According to some implementations of the optical sensor arrangement, the emitting device is implemented as a light emitting diode, for example as a light emitting diode configured to emit infrared radiation.

According to some implementations of the optical sensor arrangement, the detection device is implemented as a photodiode or as an array of photodiodes.

According to some implementations of the optical sensor arrangement, the emitting device is configured to emit infrared radiation and the detection device is configured to detect infrared radiation.

According to some applications of the optical sensor arrangement, the detection device is configured to detect infrared radiation and to detect visible light.

According to the improved concept also a proximity sensor arrangement is provided. The proximity sensor arrangement comprises an optical sensor arrangement according to the improved concept, wherein the detection device is configured to detect electromagnetic radiation being emitted by the emitting device and reflected by an object in a vicinity of the optical sensor arrangement.

According to some implementations of the proximity sensor arrangement, the detection device is configured to generate a sensor signal depending on the detected electromagnetic radiation. The proximity sensor arrangement further comprises a processing unit configured to compute a position information of the object depending on the sensor signal.

According to some implementations of the proximity sensor arrangement, the detection device is configured to detect ambient light and to generate an ambient signal based on the detected ambient light. The processing unit is configured to generate a compensated sensor signal by adjusting the sensor signal by means of the ambient signal. The processing unit is further configured to compute the position information of the object depending on the compensated sensor signal.

In the following, the improved concept is explained in detail with the aid of exemplary implementations by reference to the drawings. Components that are functionally identical or have an identical effect may be denoted by identical references. Identical components and/or components with identical effects may be described only with respect to the figure where they occur first. Their description is not necessarily repeated in subsequent figures.

DETAILED DESCRIPTION

Figure 1A:
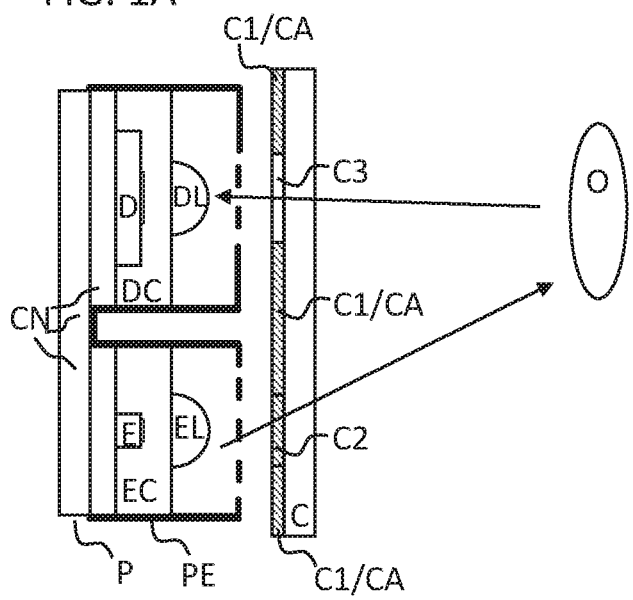
FIG. 1A shows a cross section of an exemplary implementation of an optical sensor arrangement.

FIG. 1A shows a cross section of an exemplary implementation of an optical sensor arrangement according to the improved concept.

The sensor arrangement comprises a sensor package P with a contacting arrangement CN and a package encasement PE. The sensor arrangement further comprises an emitting device E and a detection device D mounted on the contacting arrangement CN. In particular, the emitting device E and the detection device D are arranged on a first plane of the sensor arrangement. The emitting device E and the detection device D may be electrically and/or mechanically connected to the contacting arrangement CN. The emitting device E is embedded within an emitter casting EC of the sensor arrangement and the detection device D is embedded within a detector casting DC of the sensor arrangement. The sensor arrangement also comprises an emitter lens EL mounted on the emitter casting EC above the emitting device E and a detector lens DL mounted on the detector casting DC above the detection device D.

Furthermore, the sensor arrangement comprises a cover C covering the emitting device E and the detection device D.

In particular, the cover C extends along a second plane being parallel to the first plane. The sensor arrangement comprises a first cover layer C1 arranged at an inner surface of the cover C and partially covering the inner surface. The first cover layer C1 has a first opening located above the emitting device E and a second opening located above the detection device D. That is, an imaginary projection of the first and the second opening along a normal to the first and the second plane onto the first plane covers at least partially the emitting device E and the detection device D, respectively.

In the example of FIG. 1, the first cover layer C1 consists of an absorptive layer CA. At areas given by the first and the second openings, the first cover layer C1 does not cover the inner surface. The sensor arrangement comprises a second cover layer C2 covering the inner surface at the area of the first opening and a third cover layer C3 covering the inner surface at the area of the second opening.

Furthermore, an object O is shown. The sensor arrangement of FIG. 1 may for example be used for proximity detection. In particular, a presence and/or a position of the object O and/or a distance of the object O from the cover C may be determined by the sensor arrangement. To this end, the emitting device E emits light through the first opening and the second cover layer C2 acting as a first aperture, as indicated by an arrow. Then, a fraction of the emitted light is reflected by the object O and re-enters the sensor arrangement through the second opening and the third cover layer C3 acting as a second aperture as indicated by another arrow. The re-entered light may then be detected by the detection device D. Based on the detection, the detection device D may generate a sensor signal. The sensor arrangement may comprise a processing unit (not shown) for computing a position information of the object O depending on the sensor signal.

The contacting arrangement CN may be used to establish an electrical and/or mechanical connection of the sensor arrangement, the emitting device E and/or the detection device D to an electronic device, in particular to a component of the electronic device as for example a circuit board, a printed circuit board, PCB, or the like. To this end, the contacting arrangement CN may comprise a circuit board, a PCB or other connection means for electrical and/or mechanical connection.

In the shown implementation, the emitting device E is for example implemented as a light emitting diode, LED, in particular as an infrared emitting diode, IR-LED. That is, the emitting device E is configured to emit light within an emission spectrum, wherein the emission spectrum lies entirely or predominantly in the infrared range of electromagnetic radiation, that is at or above a wavelength of 700 nm, for example between 700 nm and 1400 nm or in a higher wavelength range. In other implementations, the emitting device may be configured to emit visible light or to predominantly emit visible light.

In the shown implementation, the detection device D is for example implemented as a photodiode. In particular, the detection device D is configured to detect light in the emission spectrum of the emitting device E. Consequently, if the emitting device E is implemented as an IR-LED, the detection device D is implemented as an infrared sensitive photodiode. That is, the detection device D is configured to detect infrared radiation. Alternatively or in addition, the detection device D may also be sensitive to visible light. In this case, the detection device D may detect light in the emission spectrum but also detect light entering the sensor arrangement, which was not emitted by the emitting device E, for example ambient light.

The emitter casting EC and the detector casting DC are optional components and may serve for example to protect the emitting and the detection device E, D, respectively, from mechanical damage, humidity, dust or other external influences. The emitter casting EC and the detector casting DC may also feature optical functionalities as for example diffusion, scattering or distribution of light or, in particular in case of the emitter casting EC, conversion of light from a native emission spectrum to the desired emission spectrum of the emitting device E.

The emitter lens EL and the detector lens DL are also optional and may serve for example for collimating and/or directing light being emitted by the emitting device E and to be detected by the detection device D, respectively. The emitter lens EL and the detector lens DL may also serve for defining an emission angle of the emitting device E and a detection angle of the detection device D, respectively.

The package encasement PE is also optional and may further enhance mechanical stability of the sensor arrangement and/or protection of the emitting and the detection device E, D from external influences. For light emitted by the emitting device E to be able to leave the sensor arrangement and for light to be detected by the detection device D to be able to reach the detection device D, respectively, the package encasement has openings or transparent or translucent areas located above the emitting and the detection device E,D, respectively. These openings or transparent or translucent areas are indicated by dashed lines.

The cover C is transparent or translucent for visible light and for electromagnetic radiation within the emission spectrum, for example for infrared light. The cover C may for example be made of or comprise glass or a plastic material. The cover C may for example be mechanically connected to the electronic device or may be a part of the electronic device. In alternative implementations, the cover C may also be mechanically connected to the package P and/or the package encasement PE.

The absorptive layer CA may for example be implemented as an ink, in particular an ink for absorbing light within the emission spectrum. The absorptive layer CA may be formed by an ink for absorbing visible and/or infrared light, for example a black ink. The absorptive layer CA has an average absorptance for light within the emission spectrum of the emitting device being greater than or equal to a specified first absorptance threshold value. The first absorptance threshold value may for example be equal to or greater than 90%, for example 95% or greater than 95%. Consequently, optical crosstalk may be reduced. In addition, the absorptive layer CA may also have an average absorption for visible light being equal to or greater than an additional absorptance threshold value. The additional absorptance threshold value may for example be equal to or greater than 90%, for example 95% or greater than 95%. In this case, the absorptive layer CA may appear black to the human eye.

The second cover layer C2 is for example implemented as an infrared filter layer. In particular, the second cover layer C2 passes infrared light, in particular light within the emission spectrum, and blocks visible light. That is, the second cover layer C2 has an average absorptance $A_{2av}$ for visible light being greater than or equal to a specified second absorptance threshold value. The average absorptance for visible light $A2_{av}$ of the second cover layer C2 may for example be determined according to the formula $$A2_{av} = \int_0^{lm} K1 \cdot V(l) \cdot A2(l) dl / \int_0^{lm} K2 \cdot V(l) dl. \tag{1}$$

Therein, l denotes the wavelength, V(l) represents a luminosity function describing human average spectral sensitivity of brightness perception, for example the photopic luminosity function. K1 and K2 represent weighting factors that may or may not depend on wavelength and lm represents a maximum wavelength. The maximum wavelength lm corresponds to an arbitrary wavelength that is not being perceived by the human eye and may for example be chosen accordingly for performing the calculation. A2(1) corresponds to the absorptance of the second cover layer C2 as a function of wavelength. Alternatively, the average absorptance for visible light $A2_{av}$ of the second cover layer C2 may also be calculated in another suitable way. For example the luminosity function V(l) may be omitted in formula (1).

The second absorptance threshold value $A2_{av}$ may for example be equal to or greater than 90%, for example 95% or greater than 95%. In particular, the second absorptance threshold value may be equal or approximately equal to the first absorptance threshold value. Consequently the second cover layer C2 may appear black to the human eye. It follows, that the second cover layer C2 and the first cover layer C1 may not be distinguishable by the human eye. Therefore, the second cover layer C2 is in a sense invisible for the human eye. That is, the first opening is camouflaged or disguised by adapting the optical properties, in particular the average absorptance $A2_{av}$, of the second cover layer C2 to the optical properties, in particular the average absorptance, of the first cover layer C1. In this sense, the second cover layer C2 represents an invisible opening or an invisible aperture of the sensor arrangement.

The second cover layer C2 has an average transmittance for light within the emission spectrum, that is for example for infrared light, being greater than or equal to a specified first transmittance threshold value. The first transmittance threshold value may for example be equal to or greater than 60%, for example equal or greater than 70%, for example equal to or greater than 80%.

The third cover layer C3 is for example implemented as an infrared filter layer as well. That is, the third cover layer C3 passes infrared light, in particular light within the emission spectrum, and blocks visible light. The third cover layer C3 has an average transmittance for light within the emission spectrum being greater than or equal to a specified second transmittance threshold value. The second transmittance threshold value may for example be equal to or greater than 70%, for example equal or greater than 80%, for example equal or greater than 90%.

The third cover layer C3 has an average transmittance for light within the visible spectrum $T3_{av}$ being greater than or equal to a specified third transmittance threshold value. The average transmittance for visible light $T3_{av}$ of the third cover layer C3 may for example be determined according to the formula $$T3_{av}=\int_0^{lm} K3 \cdot V(l) \cdot T3(l)dl / \int_0^{lm} K4 \cdot V(l)dl. \quad (2)$$

Therein, K3 and K4 represent weighting factors that may or may not depend on wavelength. T3(1) corresponds to the transmittance of the third cover layer C3 as a function of wavelength. Alternatively, the average transmittance for visible light $T3_{av}$ of the third cover layer C3 may also be calculated in another suitable way.

The third transmittance threshold value may for example be equal to or greater than 5%, for example equal to or greater than 10%. Consequently the third cover layer C3 may appear grey and transparent or translucent to the human eye. It follows, that the third cover layer C3 is distinguishable from the first cover layer C1 by the human eye. Therefore, the third cover layer C3 is in a sense visible for the human eye.

In principle, the third cover layer C3 may be implemented analogously to the second cover layer C2, that is both appearing black or in a sense invisible to the human eye. However, by allowing the third cover layer C3 to pass a certain amount of visible light, given by the third transmittance threshold value, it is possible for the detection device D to detect not only light being emitted by the emitting device E and reflected by the object O, but also ambient light. Consequently, the detection device D may generate an ambient signal based on the detected ambient light. The processing unit may then generate a compensated sensor signal by adjusting the sensor signal by means of the ambient signal. Due to the compensation, a the position information may be improved, for example in accuracy.

The second and the third cover layer C2, C3 may for example comprise an ink or consist of an ink, in particular an infrared filtering ink. To achieve the different absorptance and transmittance for visible and infrared light of the second and the third cover layer C2, C3, respectively, different types of ink may be used for the second and the third cover layer C2, C3. Alternatively or in addition, the second and the third cover layer C2, C3 may feature different thicknesses. In particular, the greater the thickness, the greater may be an average absorptance of the respective cover layer C2, C3 for visible and/or infrared light. Correspondingly, the greater the thickness, the smaller may be an average transmittance of the respective cover layer C2, C3 for visible and/or infrared light. For some types of infrared ink, a doubling in the thickness may result in a decrease in transmittance in the order of 99% for visible light and 20% for infrared light.

In the shown example, there is a distance between the cover C or the first, second and third cover layers C1, C2, C3, respectively, and the package encasement PE. It is pointed out that, as all other dimensions shown in the Figures, this distance may not be depicted to scale. In particular, the distance may also be zero.

Figure 1B:
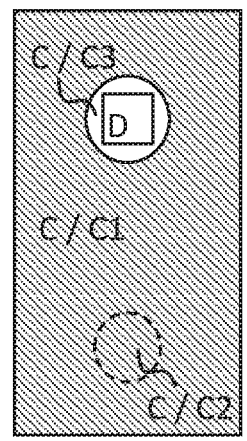
FIG. 1B shows a top view of the optical sensor arrangement of FIG. 1A.

FIG. 1B shows a top view of the optical sensor arrangement of FIG. 1A.

The detection device D may be visible for the human eye since the average transmittance of the third cover layer C3 is equal to or greater than the third transmittance threshold value for visible light, as explained with respect to FIG. 1A. In contrast, the emitting device E is not visible or barely visible to the human eye since the average absorptance of the second cover layer C2 is equal to or greater than the second absorptance threshold value for visible light, as explained with respect to FIG. 1A.

Figure 2:
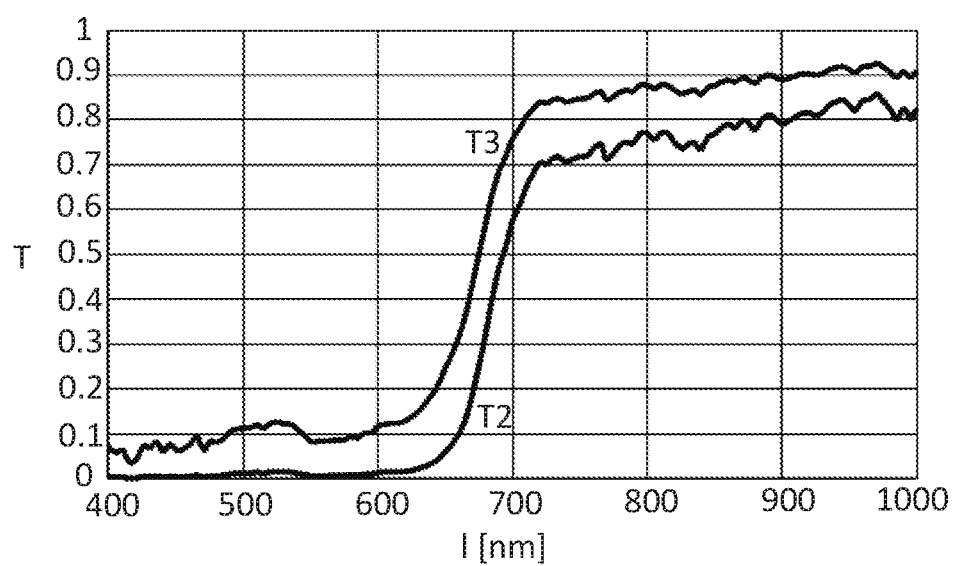
FIG. 2 shows transmittances as a function of wavelength of a second and a third cover layer of a further exemplary implementation of an optical sensor arrangement.

FIG. 2 shows transmittances as a function of wavelength of a second and a third cover layer C2, C3 of a further exemplary implementation of an optical sensor arrangement according to the improved concept. The corresponding sensor arrangement may for example be a sensor arrangement as shown in FIGS. 1A and 1B. The axis of ordinates shows transmittance T as a function of wavelength l.

The curve T2 represents the transmittance of the second cover layer C2 as a function of wavelength l. The transmittance of the second cover layer C2 lies below approximately 3% for wavelengths between 400 nm and approximately 650 nm, that is in the visible range. On the other hand, the transmittance of the second cover layer C2 lies above 70% for wavelengths between approximately 720 nm and 1000 nm. The curve T2 represents the infrared filter property of the second cover layer C2.

The curve T3 represents the transmittance of the third cover layer C3 as a function of wavelength l. The transmittance of the third cover layer C3 lies between approximately 3% and 20% for wavelengths between 400 nm and approximately 650 nm, that is in the visible range. On the other hand, the transmittance of the third cover layer C3 lies above 80% for wavelengths between approximately 710 nm and 1000 nm. The curve T3 represents the infrared filter property of the third cover layer C3. Due to the higher transmittance for visible light of the third cover layer C3 compared to the second cover layer C2, ambient light may enter the sensor arrangement through the third cover layer C3.

Figure 3A:
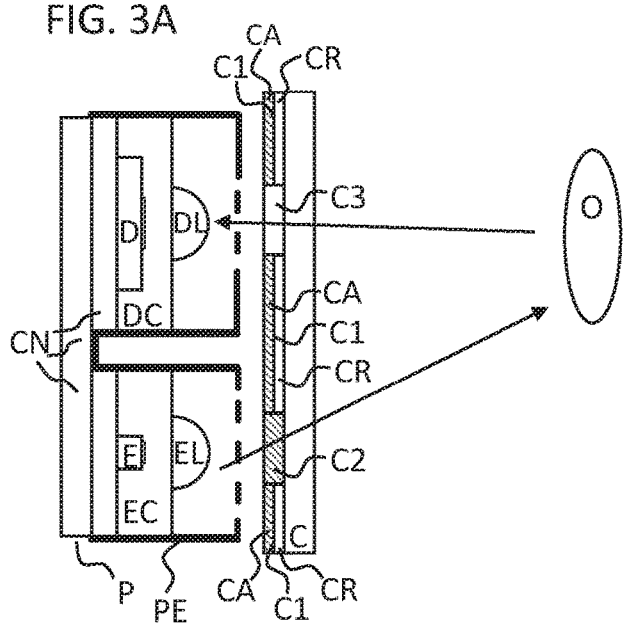
FIG. 3A shows a cross section of a further exemplary implementation of an optical sensor arrangement.

FIG. 3A shows a cross section of a further exemplary implementation of an optical sensor arrangement according to the improved concept. The sensor arrangement of FIG. 3A is based on the sensor arrangement of FIG. 1A.

In the implementation of FIG. 3A, the first cover layer C1 comprises a reflective layer CR arranged between the absorptive layer CA and the inner surface of the cover C. The reflective layer CR is for example implemented as a white or grey ink layer with an average reflectance being greater than or equal to a specified first reflectance threshold value for incident visible light. Therein, incident means incident from outside of the sensor arrangement. In particular, the reflective layer CR may be implemented as an opaque white or grey ink layer. The white ink may be opaque for visible and infrared light.

The average reflectance for visible light $R1_{av}$ of the reflective layer CR may for example be determined according to the formula $$R1_{av} = \int_0^{lm} K5 \cdot V(l) \cdot R1(l) dl / \int_0^{lm} K6 \cdot V(l) dl. \quad (3)$$

Therein, K5 and K6 represent weighting factors that may or may not depend on wavelength. R1(1) corresponds to the reflectance of the reflective layer CR as a function of wavelength. Alternatively, the average reflectance for visible light $R1_{av}$ of the reflective layer CR may also be calculated in another suitable way.

The first reflectance threshold value may for example be equal to or greater than 70%, for example equal to a greater than 80%, for example equal to or greater than 90%. Consequently, the reflective layer CR may appear white or grey to the human eye.

As for the implementation of FIG. 1A, the second cover layer C2 is for example implemented as an infrared filter layer.

In contrast to the implementation of FIG. 1A, the third cover layer C3 is adapted to the optical properties of the reflective layer CR. In particular, if the reflective layer CR appears white or grey to the human eye, the third cover layer C3 also appears white or grey to the human eye. The third cover layer C3 has an average reflectance being greater than or equal to a specified second reflectance threshold value for incident visible light.

The average reflectance for visible light $R3_{av}$ of the third cover layer C3 may for example be determined according to the formula $$R3_{av} = \int_0^{lm} K7 \cdot V(l) \cdot R3(l) dl / \int_0^{lm} K8 \cdot V(l) dl. \quad (4)$$

Therein, K7 and K8 represent weighting factors that may or may not depend on wavelength. R3(1) corresponds to the reflectance of the third cover layer C3 as a function of wavelength. Alternatively, the average reflectance for visible light $R3_{av}$ of the third cover layer C3 may also be calculated in another suitable way.

In particular, the average reflectance for visible light $R3_{av}$ of the third cover layer C3 according to formula (4) may depend on an angle of incidence and/or an angle of reflectance. For example, the reflectance may be minimum for normal incidence of light and increase with increasing angle of incidence. In such a case, the calculation of the average reflectance for visible light $R3_{av}$ may also include an average over incident angles.

The second reflectance threshold value may for example be equal to or greater than 70%, for example equal to a greater than 80%, for example equal to or greater than 90%. In particular, the second reflectance threshold value may for example be equal to or approximately equal to the first reflectance threshold value. Consequently, the third cover layer C3 may appear white or grey to the human eye just as the reflective layer CR. It follows, that the third cover layer C3 and the reflective layer CR may not or hardly be distinguishable by the human eye. Therefore, the third cover layer C3 is in a sense invisible for the human eye. That is, the second opening is camouflaged or disguised by adapting the optical properties, in particular the average reflectance $R3_{av}$, of the third cover layer C3 to the optical properties, in particular the average reflectance, of the reflective layer CR. In this sense, the third cover layer C3 represents an invisible opening or an invisible aperture of the sensor arrangement.

In the implementation of FIG. 3A, the third cover layer C3 is for example implemented as a white or grey translucent ink layer. Alternatively, the third cover layer C3 may be implemented with a white or grey translucent plastic material. The third cover layer C3 is for example implemented as a diffusive layer for visible light. That is, light passing the third cover layer C3 may be scattered within the third cover layer C3 and/or at boundaries of the third cover layer. This diffusive property of the third cover C3 layer may also contribute to the third cover layer C3 and the reflective layer CR being not or hardly distinguishable by the human eye.

To further improve the indistinguishability of the third cover layer C3 and the reflective layer CR, the ink used for generating the third cover layer C3 and the ink used for generating the reflective layer CR may be partially blended within a transition area between third cover layer C3 and the reflective layer CR.

In alternative implementations, the color of the reflective layer CR may not be white, grey or black but another color. In particular, the color of the reflective layer CR may be characterized by the wavelength dependency of the reflectance R1(1) of the reflective layer CR.

In such implementations, the third cover layer C3 is adapted to the optical properties of the reflective layer CR. In particular, the third cover layer C3 also has the same or a similar color for the human eye as the reflective layer CR. The third cover layer C3 has then an average reflectance being greater than or equal to the specified second reflectance threshold value for incident light within a specified spectrum of visible light. The specified spectrum may be determined by the reflectance R1(1) of the reflective layer CR.

The average reflectance for light within the specified spectrum may then for example be calculated in analogy to formula (4), wherein the luminosity function V(l) is replaced by the reflectance R1(1) of the reflective layer CR and the weighting factors K7, K8 are adapted accordingly. Consequently, the third cover layer C3 may then appear in the same color to the human eye as the reflective layer CR does. It follows, that the third cover layer C3 and the reflective layer CR may not or hardly be distinguishable by the human eye.

In such implementations, the third cover layer C3 is for example implemented as a colored translucent ink layer. Alternatively, the third cover layer C3 may be implemented with colored a colored plastic material. The third cover layer C3 is for example implemented as a diffusive layer for light within the specified spectrum.

Figure 3B:
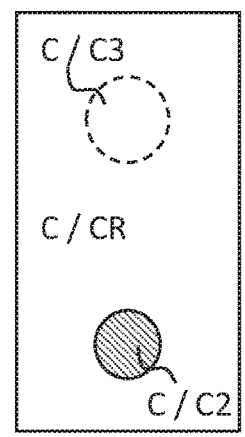
FIG. 3B shows a top view of the optical sensor arrangement of FIG. 3A.

FIG. 3B shows a top view of the optical sensor arrangement of FIG. 3A.

The second cover layer C2 may be visible for the human eye since the optical properties of the second cover layer c2 are not adapted to the optical properties of the reflective layer CR. In contrast, the third cover layer C3 is not visible or barely visible to the human eye since the average reflectance of the third cover layer C3 is equal to or greater than the second reflectance threshold value, as explained with respect to FIG. 3A.

Figure 4:
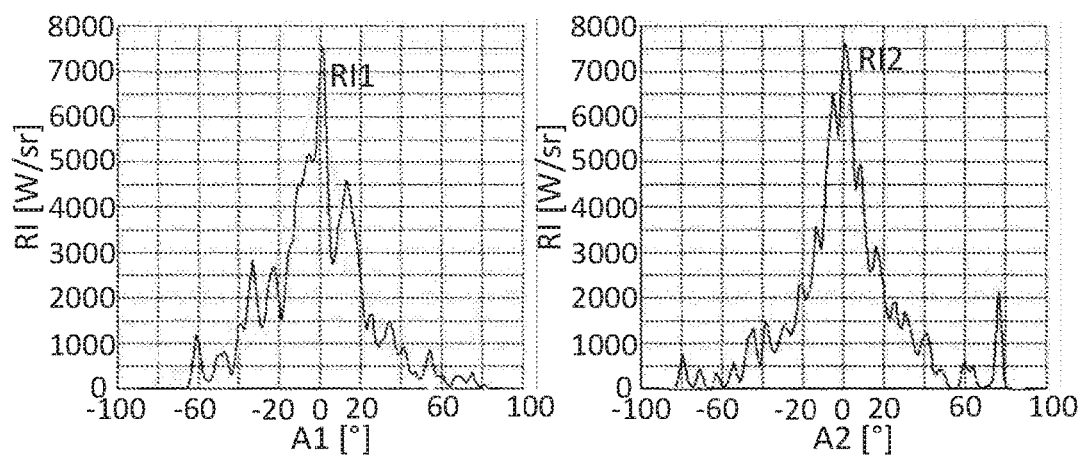
FIG. 4 shows radiant intensities as a function of exit angle of light passing through a third cover layer of a further exemplary implementation of an optical sensor arrangement according to the improved concept.

FIG. 4 shows radiant intensities as a function of exit angle of light passing through a third cover layer C3 of a further exemplary implementation of an optical sensor arrangement according to the improved concept. The corresponding sensor arrangement may for example be a sensor arrangement as shown in FIGS. 3A and 3B. The axes of ordinates shows radiant intensity RI as a function of a first exit angle A1 and a second exit angle A2, respectively.

For obtaining the curves of FIG. 4, a collimated beam of white light is directed to the center of the third cover layer C3, which is implemented as a white translucent and diffusive ink layer as described with respect to FIGS. 3A and 3B. The collimated beam passes the third cover layer C3 and is scattered within the third cover layer C3. The radiant intensity of the exiting light is measured as a function of an exit angle. Therein, the first exit angle A1 is defined with respect to a first main axis running parallel to the third cover layer C3 and through the center of the third cover layer C3. The first exit angle A2 is defined with respect to a second main axis running parallel to the third cover layer C3, through the center of the third cover layer C3 and perpendicular to the first main axis.

It can be seen from the panels of FIG. 4, that the collimated beam becomes diffused by passing the third cover layer C3.

By means of the improved concept, optical crosstalk in an optical sensor arrangement may be reduced, while, at the same time, the optical sensor arrangement appears to the human eye as if it has only one opening or aperture. This is achieved by actually using two openings or apertures, namely the first and the second opening, and the second and third cover layer C2, C3 covering the openings. Therefore, the distance between the emitting device E and the detection device D may be increased for reduction of optical crosstalk. Since one of the second and third cover layer C2, C3 is always adapted to the optical properties, namely absorptance or reflectance, of the first cover layer C1, the respective one of the second and third cover layer C2, C3 is not or hardly visible to the human eye. In particular, in the implementations of FIGS. 1A and 1B, the absorptance of the second cover layer C2 being adapted to the absorptance of the absorptive layer CA causes said effect of non-visibility. On the other hand, in the implementations of FIGS. 3A and 3B, the reflectance of the third cover layer C3 being adapted to the reflectance of the reflective layer CR causes said effect of non-visibility.

The invention claimed is:

1. An optical sensor arrangement comprising
an emitting device and a detection device configured to emit and detect electromagnetic radiation, respectively;
a cover being transparent or translucent for visible light and arranged to cover the emitting device and the detection device, the cover comprising an inner surface facing the emitting device and the detection device;
a first cover layer partially covering the inner surface and having a first opening located above the emitting device and a second opening located above the detection device;
a second cover layer covering the inner surface at an area of the first opening; and
a third cover layer covering the inner surface at an area of the second opening, the third cover layer being distinct from the second cover layer;
wherein a reflection and/or absorption characteristics for incident light within a specified spectrum of visible light of at least one of the second and the third cover layer is adapted to a reflection and/or absorption characteristics of the first cover layer for incident light within the specified spectrum;
wherein an absorption characteristic of the second cover layer for incident light within the specified spectrum is different than an absorption characteristic of the third cover layer for incident light within the specified spectrum; and
wherein the first cover layer comprises, on a side facing the cover, a reflective layer having an average reflectance being greater than or equal to a specified first reflectance threshold value for incident light within the specified spectrum.

2. The optical sensor arrangement according to claim 1, wherein the first cover layer comprises, on a side facing the emitting device and the detection device, an absorptive layer having an average absorptance being greater than or equal to a specified first absorptance threshold value for light within an emission spectrum of the emitting device.

3. The optical sensor arrangement according to claim 1, wherein the second cover layer is implemented as a filter layer for passing light within the emission spectrum and for blocking light within the specified spectrum.

4. The optical sensor arrangement according to claim 1, wherein the second cover layer has an average absorptance being greater than or equal to a specified second absorptance threshold value for incident light within the specified spectrum.

5. The optical sensor arrangement according to claim 1, wherein the third cover layer is implemented as a filter layer for passing light within the emission spectrum and for blocking light within the specified spectrum.

6. The optical sensor arrangement according to claim 1, wherein the third cover layer has an average transmittance being greater than or equal to a specified third transmittance threshold value for incident light within the specified spectrum.

7. The optical sensor arrangement according to claim 1, wherein the third cover layer has an average reflectance being greater than or equal to a specified second reflectance threshold value for incident light within the specified spectrum.

8. The optical sensor arrangement according to claim 1, wherein the third cover layer is implemented as a diffusive layer for light within the emission spectrum and/or within the specified spectrum.

9. The optical sensor arrangement according to claim 1, wherein at least one of the first, the second and the third cover layer comprises an ink and/or a plastic material.

10. The optical sensor arrangement according to claim 1, wherein the emitting device is implemented as a light emitting diode.

11. The optical sensor arrangement according to claim 1, wherein the detection device is implemented as a photodiode or as an array of photodiodes.

12. The optical sensor arrangement according to claim 1, wherein the emitting device is configured to emit infrared radiation and the detection device is configured to detect infrared radiation.

13. The optical sensor arrangement according to claim 1, wherein the detection device is configured to detect infrared radiation and to detect visible light.

14. The optical sensor arrangement according to claim 1, wherein the reflection and/or absorption characteristics for incident light within the specified spectrum of visible light of the at least one of the second and the third cover layer is adapted to the reflection and/or absorption characteristics of the first cover layer for incident light within the specified spectrum to reduce a visibility of at least one of the first and the second opening.

15. The optical sensor arrangement according to claim 1, wherein
the emitting device and the detection device are arranged on a first plane of the sensor arrangement;
a projection of the first opening along a normal to the first plane onto the first plane covers at least partially the emitting device; and
a projection of the second opening along a normal to the first plane onto the first plane covers at least partially the detection device.

16. A proximity sensor arrangement comprising an optical sensor arrangement according to claim 1, wherein the detection device is configured to detect electromagnetic radiation being emitted by the emitting device and reflected by an object in a vicinity of the optical sensor arrangement.

17. The optical sensor arrangement according to claim 1, wherein the second cover layer has a first average transmittance less than a second average transmittance of the third cover layer for incident light within the specified spectrum.

18. The optical sensor arrangement according to claim 17, wherein the detection device is visible through the third cover layer to a human eye, and wherein the emitter is substantially not visible through the second cover layer to a human eye.

19. An optical sensor arrangement comprising
an emitting device and a detection device configured to emit and detect electromagnetic radiation, respectively;
a cover being transparent or translucent for visible light and arranged to cover the emitting device and the detection device, the cover comprising an inner surface facing the emitting device and the detection device;
a first cover layer partially covering the inner surface and having a first opening located above the emitting device and a second opening located above the detection device;
a second cover layer covering the inner surface at an area of the first opening; and
a third cover layer covering the inner surface at an area of the second opening, the third cover layer being distinct from the second cover layer;
wherein a reflection and/or absorption characteristics for incident light within a specified spectrum of visible light of at least one of the second and the third cover layer is adapted to a reflection and/or absorption characteristics of the first cover layer for incident light within the specified spectrum;
wherein an absorption characteristic of the second cover layer for incident light within the specified spectrum is different than an absorption characteristic of the third cover layer for incident light within the specified spectrum;
wherein the second cover layer has a first average transmittance less than a second average transmittance of the third cover layer for incident light within the specified spectrum; and
wherein the detection device is visible through the third cover layer to a human eye, and wherein the emitter is substantially not visible through the second cover layer to a human eye.

20. The optical sensor arrangement according to claim 19, wherein the first cover layer comprises, on a side facing the emitting device and the detection device, an absorptive layer having an average absorptance being greater than or equal to a specified first absorptance threshold value for light within an emission spectrum of the emitting device.

21. The optical sensor arrangement according to claim 19, wherein the second cover layer is implemented as a filter layer for passing light within the emission spectrum and for blocking light within the specified spectrum.

22. The optical sensor arrangement according to claim 19, wherein the second cover layer has an average absorptance being greater than or equal to a specified second absorptance threshold value for incident light within the specified spectrum.

23. The optical sensor arrangement according to claim 19, wherein the third cover layer is implemented as a filter layer for passing light within the emission spectrum and for blocking light within the specified spectrum.

24. The optical sensor arrangement according to claim 19, wherein the second average transmittance of the third cover layer is greater than or equal to a specified third transmittance threshold value for incident light within the specified spectrum.

25. The optical sensor arrangement according to claim 19, wherein the first cover layer comprises, on a side facing the cover, a reflective layer having an average reflectance being greater than or equal to a specified first reflectance threshold value for incident light within the specified spectrum.

26. The optical sensor arrangement according to claim 25, wherein the third cover layer has an average reflectance being greater than or equal to a specified second reflectance threshold value for incident light within the specified spectrum.

27. The optical sensor arrangement according to claim 25, wherein the third cover layer is implemented as a diffusive layer for light within the emission spectrum and/or within the specified spectrum.

28. The optical sensor arrangement according to claim 19, wherein at least one of the first, the second and the third cover layer comprises an ink and/or a plastic material.

29. The optical sensor arrangement according to claim 19, wherein the emitting device is implemented as a light emitting diode.

30. The optical sensor arrangement according to claim 19, wherein the detection device is implemented as a photodiode or as an array of photodiodes.

31. The optical sensor arrangement according to claim 19, wherein the emitting device is configured to emit infrared radiation and the detection device is configured to detect infrared radiation.

32. The optical sensor arrangement according to claim 19, wherein the detection device is configured to detect infrared radiation and to detect visible light.

33. The optical sensor arrangement according to claim 19, wherein the reflection and/or absorption characteristics for incident light within the specified spectrum of visible light of the at least one of the second and the third cover layer is adapted to the reflection and/or absorption characteristics of the first cover layer for incident light within the specified spectrum to reduce a visibility of at least one of the first and the second opening.

34. The optical sensor arrangement according to claim 19, wherein
- the emitting device and the detection device are arranged on a first plane of the sensor arrangement;
- a projection of the first opening along a normal to the first plane onto the first plane covers at least partially the emitting device; and
- a projection of the second opening along a normal to the first plane onto the first plane covers at least partially the detection device.

35. A proximity sensor arrangement comprising an optical sensor arrangement according to claim 19, wherein the detection device is configured to detect electromagnetic radiation being emitted by the emitting device and reflected by an object in a vicinity of the optical sensor arrangement.

* * * * *